(12) United States Patent
Oh et al.

(10) Patent No.: US 12,501,663 B2
(45) Date of Patent: Dec. 16, 2025

(54) DISPLAY MODULE INCLUDING ZINC-BASED BARRIER PATTERN AND METHOD FOR MANUFACTURING SAME

(71) Applicant: SAMSUNG ELECTRONICS CO., LTD., Suwon-si (KR)

(72) Inventors: Donggun Oh, Suwon-si (KR); Jinho Kim, Suwon-si (KR); Chulgyu Jung, Suwon-si (KR); Tetsuya Shigeta, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 449 days.

(21) Appl. No.: 17/945,770

(22) Filed: Sep. 15, 2022

(65) Prior Publication Data

US 2023/0016687 A1    Jan. 19, 2023

Related U.S. Application Data

(63) Continuation of application No. PCT/KR2021/004124, filed on Apr. 2, 2021.

(30) Foreign Application Priority Data

Apr. 3, 2020   (KR) .................. 10-2020-0041216

(51) Int. Cl.
*H10D 30/67*    (2025.01)
*G09G 3/32*    (2016.01)
(Continued)

(52) U.S. Cl.
CPC ..... *H10D 30/6737* (2025.01); *H10D 30/6743* (2025.01); *H10D 64/01* (2025.01);
(Continued)

(58) Field of Classification Search
CPC .... H10D 30/6737; H10D 64/01; H10D 86/40; H10D 86/60; H10D 30/6743
(Continued)

(56) References Cited

U.S. PATENT DOCUMENTS 7,435,631 B2    10/2008   Yang
7,642,141 B2     1/2010   Toyota et al.
(Continued)

FOREIGN PATENT DOCUMENTS

EP           3608950 A1      2/2020
JP        2012-222166 A     11/2012
(Continued)

OTHER PUBLICATIONS

Communication issued Nov. 28, 2024 by the Korean Patent Office in Korean Patent Application No. 10-2020-0041216.
(Continued)

*Primary Examiner* — Norman D Richards
*Assistant Examiner* — Colin Russell Mccutcheon
(74) *Attorney, Agent, or Firm* — Sughrue Mion, PLLC

(57) ABSTRACT

A display module and a method for manufacturing the same are provided. The display module manufacturing method includes: forming a semiconductor pattern on a substrate; forming a first insulating layer covering the semiconductor pattern on the substrate; forming a gate electrode on a region of the first insulating layer corresponding to a gate region of the semiconductor pattern; forming a second insulating layer covering the gate electrode on the first insulating layer; forming a first hole passing through the first insulating layer and the second insulating layer to expose a drain region of the semiconductor pattern and forming a second hole passing through the first insulating layer and the second insulating layer to expose a source region of the semiconductor pattern; and forming a first barrier pattern on the drain region
(Continued)

in the first hole and a second barrier pattern on the source region in the second hole, and forming a drain electrode on the first barrier pattern and a source electrode on the second barrier pattern.

8 Claims, 20 Drawing Sheets

(51) Int. Cl.
  *H10D 64/01* (2025.01)
  *H10D 86/40* (2025.01)
  *H10D 86/60* (2025.01)
(52) U.S. Cl.
  CPC ............ *H10D 86/40* (2025.01); *H10D 86/60* (2025.01); *G09G 3/32* (2013.01); *G09G 2300/0426* (2013.01); *G09G 2320/0247* (2013.01)
(58) Field of Classification Search
  USPC .......................................................... 257/72
  See application file for complete search history.

(56) References Cited

U.S. PATENT DOCUMENTS

| | | | |
|---|---|---|---|
| 8,368,077 B2 | 2/2013 | Kuriyagawa et al. | |
| 8,482,189 B2 | 7/2013 | Goto et al. | |
| 8,674,359 B2 | 3/2014 | Noh et al. | |
| 9,231,107 B2 | 1/2016 | Kwon et al. | |
| 9,721,978 B2 | 8/2017 | Wang et al. | |
| 2006/0275618 A1 | 12/2006 | Kugimiya et al. | |
| 2015/0171154 A1* | 6/2015 | Kang | H10K 50/844 438/151 |
| 2018/0033642 A1 | 2/2018 | Lu et al. | |
| 2018/0294413 A1* | 10/2018 | Riegel | H10K 71/20 |
| 2019/0148412 A1 | 5/2019 | Shida et al. | |
| 2019/0345585 A1* | 11/2019 | Sherman | C22C 1/047 |
| 2020/0066765 A1* | 2/2020 | Cho | H10D 86/471 |
| 2020/0098924 A1 | 3/2020 | Kim et al. | |

FOREIGN PATENT DOCUMENTS

| | | | | |
|---|---|---|---|---|
| JP | 5138276 B2 | | 2/2013 | |
| JP | 5426138 B2 | | 2/2014 | |
| KR | 10-2007-0067262 A | | 6/2007 | |
| KR | 10-0802879 B1 | | 2/2008 | |
| KR | 10-2011-0105805 A | | 9/2011 | |
| KR | 10-1108175 B1 | | 1/2012 | |
| KR | 10-1108369 B1 | | 1/2012 | |
| KR | 10-2014-0017854 A | | 2/2014 | |
| KR | 2014/0017854 A | * | 2/2014 | ............ H01L 51/50 |
| KR | 10-2014-0076471 A | | 6/2014 | |
| KR | 10-2015-0011596 A | | 2/2015 | |
| KR | 10-2015-0141452 A | | 12/2015 | |
| KR | 10-2017-0002529 A | | 1/2017 | |
| KR | 10-2018-0133455 A | | 12/2018 | |
| KR | 10-2019-0131582 A | | 11/2019 | |
| KR | 10-2020-0023573 A | | 3/2020 | |
| KR | 10-2020-0034083 A | | 3/2020 | |

OTHER PUBLICATIONS

Written Opinion (PCT/ISA/237) issued by the International Searching Authority dated Jul. 16, 2021 in International Application No. PCT/KR2021/004124.

International Search Report (PCT/ISA/210) issued by the International Searching Authority dated Jul. 16, 2021 in International Application No. PCT/KR2021/004124.

Communication issued on Aug. 26, 2025 by the Korean Intellectual Property Office in Korean Patent Application No. 10-2020-0041216.

* cited by examiner

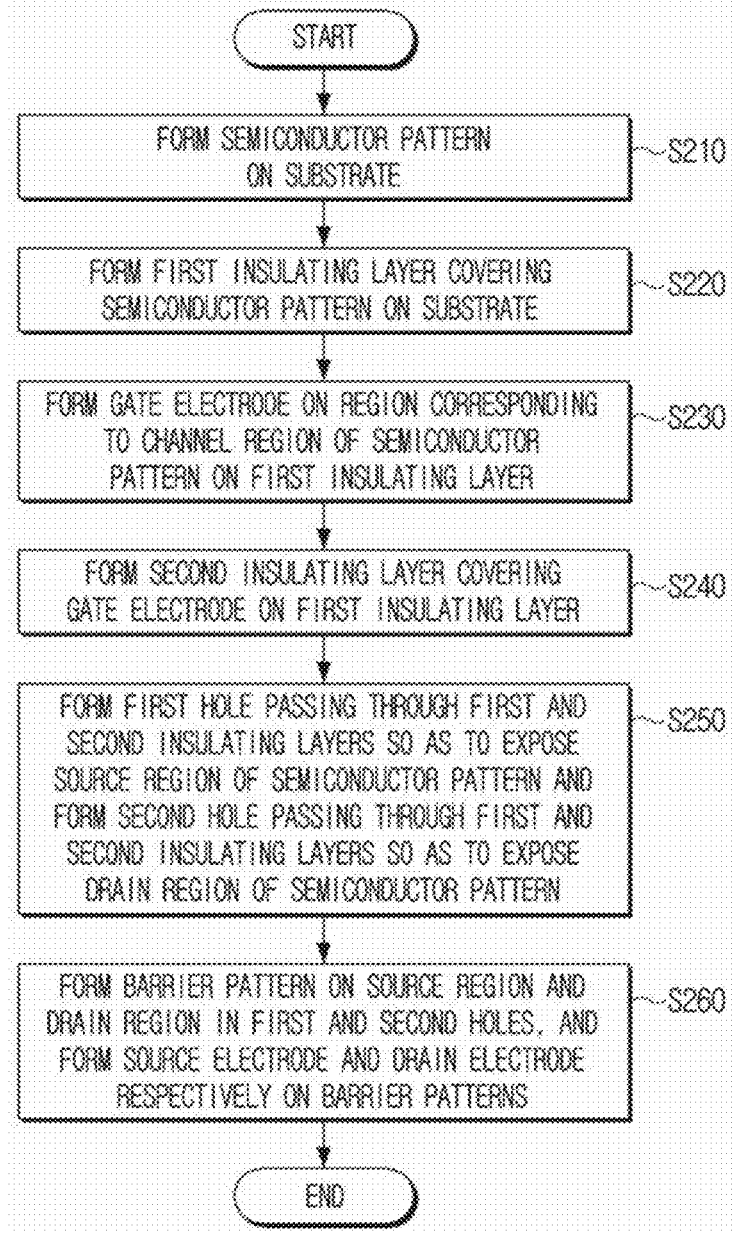

FIG. 17A

| ITEM | Zn SINGLE LAYER | Zn/Cu DOUBLE LAYER | Zn-Ti SINGLE LAYER | Zn-Ti/Cu DOUBLE LAYER |
|---|---|---|---|---|
| SIDE ETCH SKEW (μm) | 4.67 | 2.35 | 0 | 0.54 |
| T/A (°) | UNDER CUT | UNDER CUT | UNDER CUT | 33 |

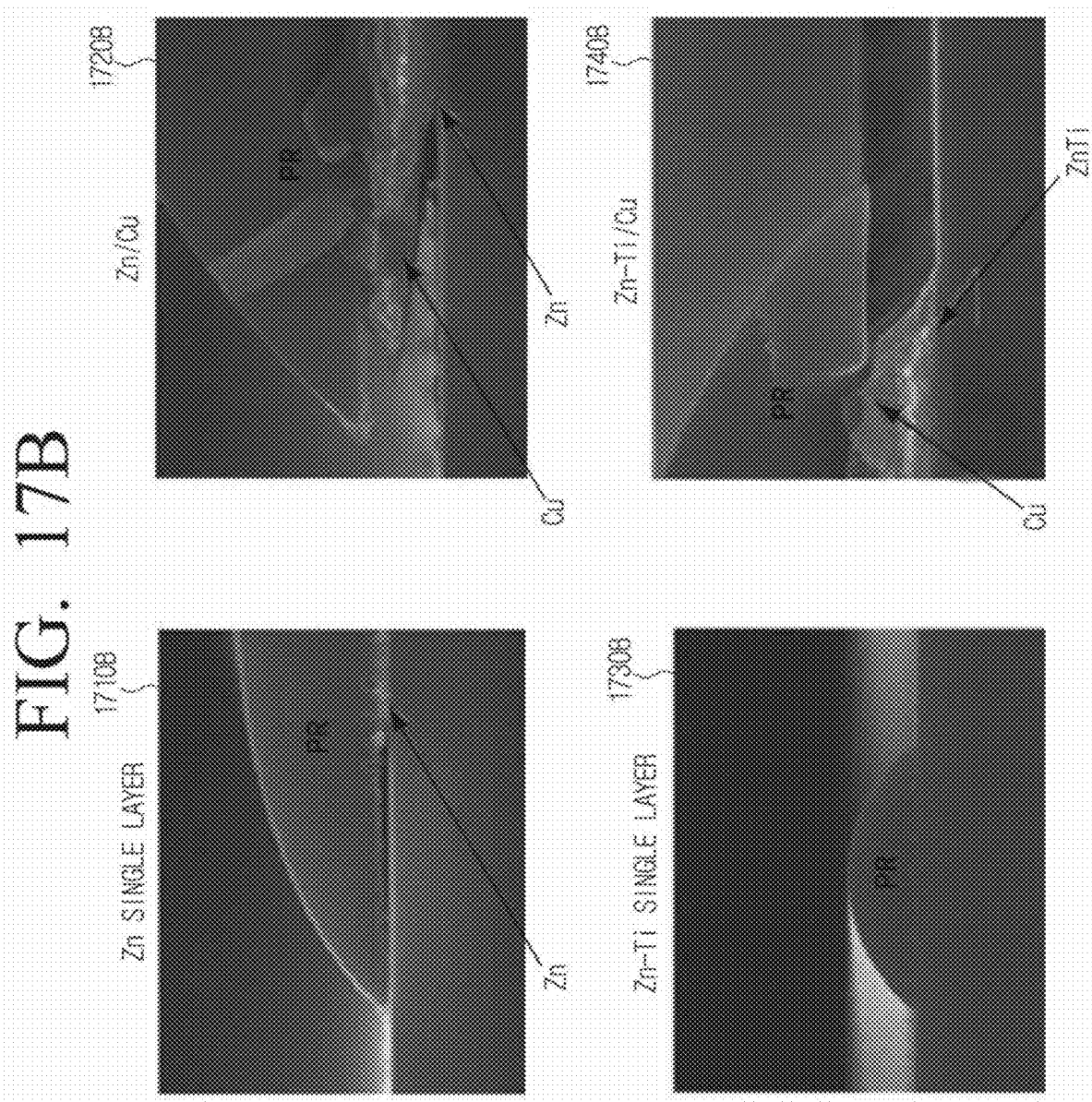

FIG. 18
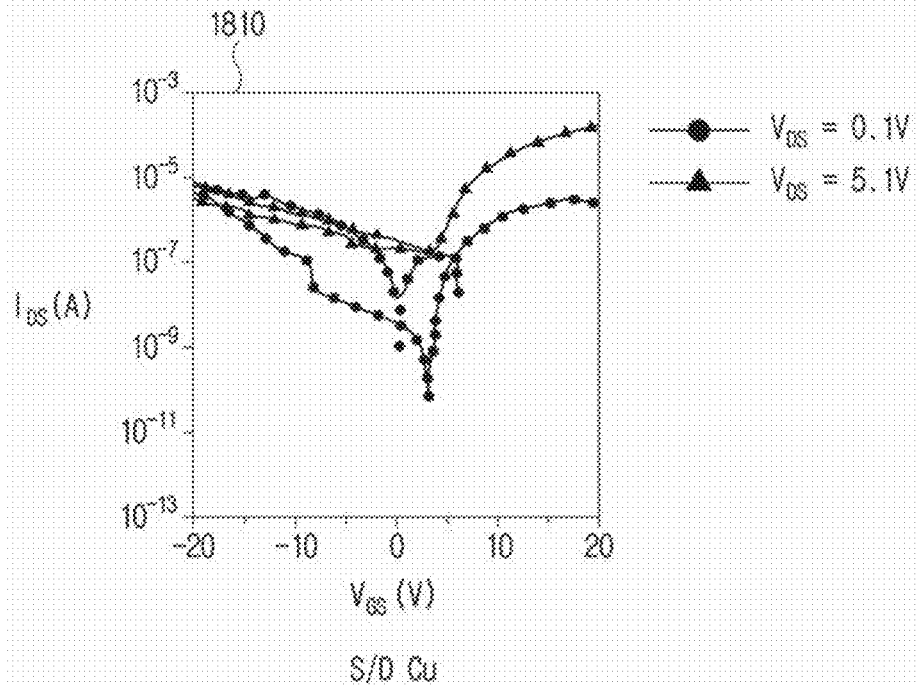
S/D Cu
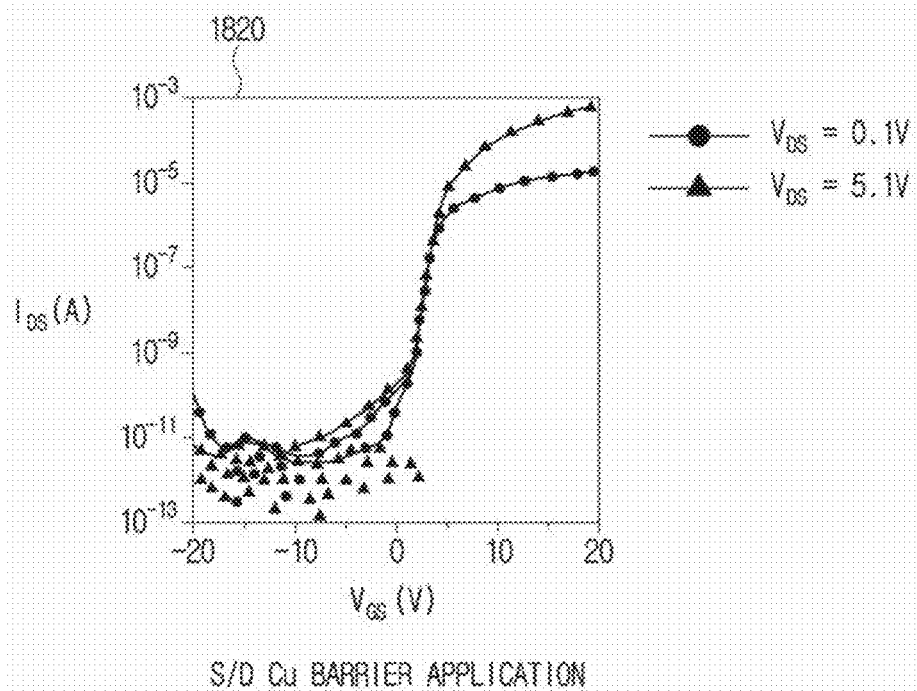
S/D Cu BARRIER APPLICATION

DISPLAY MODULE INCLUDING ZINC-BASED BARRIER PATTERN AND METHOD FOR MANUFACTURING SAME

CROSS-REFERENCE TO RELATED APPLICATION(S)

This application is a continuation application of International Application No. PCT/KR2021/004124, filed on Apr. 2, 2021, which is based on and claims priority to Korean Patent Application No. 10-2020-0041216, filed on Apr. 3, 2020, in the Korean Intellectual Property Office, the disclosures of which are incorporated by reference herein in their entireties.

BACKGROUND

1. Field

This disclosure relates to a display module and a method for manufacturing the same, and more particularly, to a display module and a method for manufacturing the same.

2. Description of Related Art

A thin film transistor (TFT) controls driving of a pixel in a display device. Here, the pixels are composed of sub-pixels, and the pixels may represent various colors through a combination of the color and luminance of light represented by the sub-pixels.

For fast change of a screen of a display device, it may be required that a TFT controlling each pixel quickly reacts and operates. In the case of a display device using a self-emitting element such as an organic light emitting element or an inorganic light emitting element as a pixel, high current driving of the TFT may be required for excellent luminance characteristics (e.g., high luminance, uniform luminance, etc.).

When the electrical resistance of a material used for wiring (or electrode) of the TFT is high, there is a problem that voltage drop occurs. In this example, there is a problem in that a flicker phenomenon in which luminance of a pixel is not constant, changes, and vibrates, and luminance deviation indicating a difference between an average value of the luminance measured in the entire or partial screen area of the display device and the luminance measured in a specific area, and in particular, as the size of the display becomes large, this phenomenon may get worsen.

If copper (Cu) having low electrical resistance is used for wiring of TFT, there may be a problem in that the characteristic of TFT may be degraded due to contamination of the copper.

SUMMARY

Provided are a display module for driving a pixel and a manufacturing method thereof.

According to an aspect of the disclosure, a method of manufacturing a display module includes: forming a semiconductor pattern on a substrate; forming a first insulating layer covering the semiconductor pattern on the substrate; forming a gate electrode on a region of the first insulating layer corresponding to a gate region of the semiconductor pattern; forming a second insulating layer covering the gate electrode on the first insulating layer; forming a first hole passing through the first insulating layer and the second insulating layer to expose a drain region of the semiconductor pattern and forming a second hole passing through the first insulating layer and the second insulating layer to expose a source region of the semiconductor pattern; and forming a first barrier pattern on the drain region in the first hole and a second barrier pattern on the source region in the second hole, and forming a drain electrode on the first barrier pattern and a source electrode on the second barrier pattern.

The drain electrode and the source electrode may include Cu, and the first barrier pattern and the second barrier pattern may include Zn-based alloy.

The Zn-based alloy may include Zn having content greater than or equal to 90 wt % and at least one of Ti, Mo, Au, Al, Mg, Sn, and Sb.

The Zn-based alloy may have a thickness in a range of 50 Å to 500 Å.

The forming the first barrier pattern, the second barrier pattern, the drain electrode, and the source electrode may include: forming a barrier layer on the second insulating layer in which the first hole and the second hole are formed; forming an electrode layer on the barrier layer; and forming the first barrier pattern, the second barrier pattern, the drain electrode and the source electrode by patterning the barrier layer and the electrode layer simultaneously.

The patterning the barrier layer and the electrode layer simultaneously may include performing a photolithography process.

The forming the electrode layer may include, after forming the barrier layer, forming the electrode layer in the barrier layer consecutively in a chamber to prevent oxidation of the first barrier pattern and the second barrier pattern.

The semiconductor pattern may include low temperature poly silicon (LTPS), and the forming the semiconductor pattern may include: forming a buffer layer to block diffusion of a material included in the substrate into the semiconductor pattern on the substrate; depositing amorphous silicon (a-Si) on the buffer layer; and forming the LTPS with changed crystalline arrangement of the a-Si by irradiating the a-Si with a laser.

The method may further include: forming a pixel electrode on the drain electrode; and bonding a micro light emitting diode on the pixel electrode to be connected to the pixel electrode and a common electrode separate from the pixel electrode.

According to an aspect of the disclosure, a display module includes: a substrate; a semiconductor pattern provided on the substrate and including a gate region, a drain region, and a source region; a first insulating layer provided on the substrate, and covering a region of the semiconductor pattern other than the drain region and the source region; a gate electrode provided on a region of the first insulating layer corresponding to the gate region of the semiconductor pattern; a second insulating layer provided on the first insulating layer and covering the gate electrode; a first barrier pattern provided on the drain region; a second barrier pattern provided on the source region; a drain electrode provided on the first barrier pattern; and a source electrode provided on the second barrier pattern.

The drain electrode and the source electrode may include Cu, and the first barrier pattern and the second barrier pattern may include Zn-based alloy.

The Zn-based alloy may include Zn having content greater than or equal to 90 wt % and at least one of Ti, Mo, Au, Al, Mg, Sn, and Sb.

The Zn-based alloy may have thickness in a range of 50 Å to 500 Å.

The first barrier pattern and the second barrier pattern may surround a sidewall of the first insulating layer and the second insulating layer on the drain region and the source region, respectively.

The semiconductor pattern may include low temperature poly silicon (LTPS).

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 2 is a flowchart illustrating a method of manufacturing a display module according to an embodiment of the disclosure;

FIG. 17A is a diagram illustrating an etching characteristic according to an embodiment of the disclosure;

FIG. 17B is a diagram illustrating an etching characteristic according to an embodiment of the disclosure; and FIG. 18 is a diagram illustrating the TFT characteristic according to an embodiment of the disclosure.

DETAILED DESCRIPTION

Figure 1A:
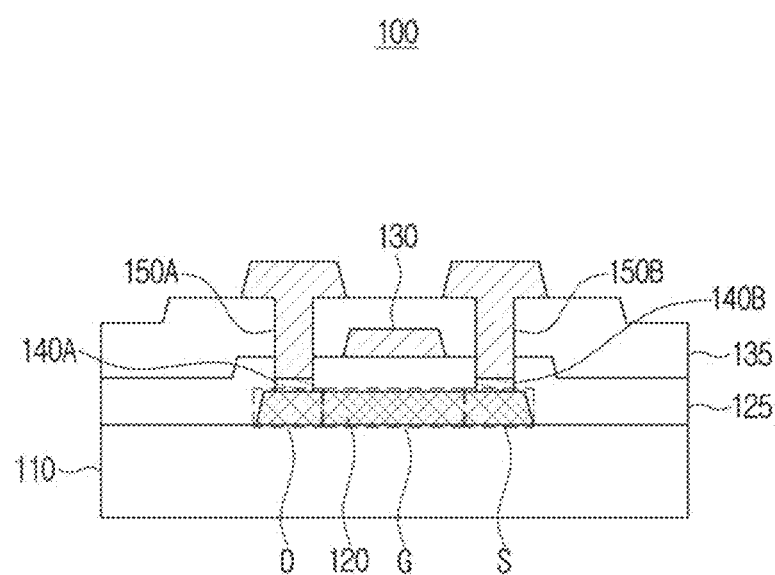
FIG. 1A is a diagram illustrating a configuration of a display module according to an embodiment of the disclosure.

In the disclosure, a detailed description of known functions or configurations incorporated herein will be omitted as it may make the subject matter of the disclosure unclear. In addition, the embodiments described below may be modified in various different forms, and the scope of the technical concept of the disclosure is not limited to the following embodiments. Rather, these embodiments are provided so that this disclosure will be thorough and complete, and will fully convey the scope of the disclosure to those skilled in the art.

It is to be understood that the techniques described in this disclosure are not intended to be limited to particular embodiments and include various modifications, equivalents, and/or alternatives of embodiments of the disclosure. In connection with the description of the drawings, similar reference numerals may be used for similar components.

In addition, expressions "first", "second", or the like, used in the disclosure may indicate various components regardless of a sequence and/or importance of the components, will be used only in order to distinguish one component from the other components, and do not limit the corresponding components.

The expressions "A or B," "at least one of A and/or B," or "one or more of A and/or B," and the like include all possible combinations of the listed items. For example, "A or B," "at least one of A and B," or "at least one of A or B" includes (1) only A, (2) only B, or (3) both A and B.

In the disclosure, a singular representation includes a plurality of representations unless the context clearly indicates otherwise. It should be understood that in the present application, the terms "comprise" or "configure" are intended to specify the presence or addition of one or more other features or numbers, steps, operations, components, components, or combinations thereof, without specifying that there are features, integers, steps, operations, components, components, or combinations thereof, as described herein.

It is to be understood that an element (e.g., a first element) is "operatively or communicatively coupled with/to" another element (e.g., a second element) is that any such element may be directly connected to the other element or may be connected via another element (e.g., a third element). On the other hand, when an element (e.g., a first element) is "directly connected" or "directly accessed" to another element (e.g., a second element), it may be understood that there is no other element (e.g., a third element) between the other elements.

Herein, the expression "configured to" may be used interchangeably with, for example, "suitable for," "having the capacity to," "designed to," "adapted to," "made to," or "capable of" The expression "configured to" does not necessarily mean "specifically designed to" in a hardware sense. Instead, under some circumstances, "a device configured to" may indicate that such a device can perform an action along with another device or part. For example, the expression "a processor configured to perform A, B, and C" may indicate an exclusive processor (e.g., an embedded processor) to perform the corresponding action, or a generic-purpose processor (e.g., a central processor (CPU) or application processor (AP)) that can perform the corresponding actions by executing one or more software programs stored in the memory device.

FIG. 1A is a diagram illustrating a configuration of a display module according to an embodiment of the disclosure.

Referring to FIG. 1A, a display module 100 may include a substrate 110, a semiconductor pattern 120, a first insulating layer 125, a gate electrode 130, a second insulating layer 135, a barrier pattern 140A, 140B, a drain electrode 150A, and a source electrode 150B.

The substrate 110 may support and protect various electronic elements constituting a circuit. Various electronic elements (or metals, semiconductors, insulators, etc.) may be formed in a single-layer or multi-layer structure on the substrate 110 to form a circuit. The substrate 110 may be made of a material having a transparent property or a rigid or flexible property depending on the design characteristics of the display module 100. For example, the substrate 110 may be made of various materials such as glass, polyimide (PI), polyethylene terephthalate (PET), polyethylene naphthalate (PEN), polyvinyl chloride (PVC), poly methyl methacrylate (PMMA), and the like.

The semiconductor pattern 120 may be formed on the substrate 110. The semiconductor pattern 120 may be referred to as an active layer.

The semiconductor pattern 120 may be formed with a channel through which a current may flow according to a voltage (e.g., a voltage greater than a threshold voltage) of the gate electrode 130. The first insulating layer 125 may be formed between the semiconductor pattern 120 and the gate electrode 130.

The semiconductor pattern 120 may include a gate region G, a drain region D, and a source region S. Specifically, the gate region G may represent a region adjacent to the gate electrode 130 in the semiconductor pattern 120. The drain region D may refer to a region adjacent to the drain electrode 150A in the semiconductor pattern 120 and located on one side of the gate region G. The source region S may refer to a region adjacent to the source electrode 150B in the semiconductor pattern 120 and located on the other side of the gate region G. Each region, such as a gate region G, may be a reference to a region where each electrode, such as the gate electrode 130, is formed.

The semiconductor pattern 120 may include a low temperature poly silicon (LTPS). The LTPS may be formed at a temperature at which the substrate 110 is not deformed through a laser process. For example, the LTPS may be formed by changing a crystalline arrangement of amorphous silicon (a-Si) when a laser is irradiated to a-Si. Here, the crystalline arrangement of the a-Si has a structure in which Si atoms are randomly arranged, and the crystalline arrangement of the LTPS may have a structure in which Si atoms are arranged orderly. Specifically, in the crystalline arrangement, atoms may be periodically arranged in specific orient in a grain and an orient may be different at a grain boundary.

In this example, the LTPS may have fast moving performance of electrons similar to single crystal silicon in the same crystal grain boundary. In the case of the LTPS, the pixel may be driven by transferring the current at a faster response speed in that the moving speed of the electrons is about 100 times faster than that of the a-Si. In the case of LTPS, a desired amount of current may be sufficiently transferred in a short time, so that LTPS may be effective for a high resolution display device in which pixels (or circuit configuration) are dense or a large display device in which wiring is lengthened.

According to an embodiment of the disclosure, the semiconductor pattern 120 may be implemented as an oxide semiconductor. The oxide semiconductor may be formed of an oxide including at least one element selected from indium (In), gallium (Ga), zinc (Zn), and tin (Sn), and, for example, an oxide semiconductor may include zinc oxide, tin oxide, indium oxide, In—Zn oxide, In—Sn oxide, In—Ga—Zn oxide (IGZO), In—Zn—Sn oxide, In—Ga—Zn—Sn oxide, and the like. The semiconductor pattern 120 is not limited to the above examples, but may be formed of various materials such as single crystal silicon, a-S, graphene, etc.

The first insulating layer 125 may be formed on the substrate 110 to cover the semiconductor pattern 120. The first insulating layer 125 may be formed to cover a region excluding the drain region D and the source region S in the semiconductor pattern 120. The first insulating layer 125 may include an insulating material, for example, the first insulating layer 125 may include inorganic or organic materials such as silicon nitride (SiNx) or silicon oxide (Sio2, SiOx).

In one region of a layer where the first insulating layer 125 is formed, the barrier patterns 140A and 140B may be formed. One region may be in contact with one side of the semiconductor pattern 120. For example, barrier patterns 140A and 140B may be formed in an upper region of the drain region D and the source region S of the semiconductor pattern 120. The first insulating layer 125 may be formed to cover the other side of the semiconductor pattern 120 other than one side surface of the semiconductor pattern 120. The first insulating layer 125 may prevent the semiconductor pattern 120 from being exposed to the outside.

The first insulating layer 125 may protect the semiconductor pattern 120 from external foreign substances moisture, or the like, and may electrically insulate the semiconductor pattern 120 and the gate electrode 130.

The gate electrode 130 may be formed on a region corresponding to the gate region G in the first insulating layer 125. A region corresponding to the gate region G in the first insulating layer 125 may represent a region of the first insulating layer 125 present on the gate region G. The gate electrode 130 may include a low-resistance conductive material, and for example, the gate electrode 130 may include Cu. Here, Cu may have conductivity higher than gold (Au) or molybdenum (Mo) (i.e., the resistivity may be low). The embodiment is merely an example, and the gate electrode 130 may be formed of a material including various metal materials such as Au, silver (Ag), Mo, aluminum (Al0, etc.

The gate electrode 130 and the semiconductor pattern 120 may be spaced apart with the first insulating layer 125 therebetween. The gate electrode 130 may control flow of current so that current flows or current does not flow over the semiconductor pattern 120 according to voltage of the gate electrode 130.

The second insulating layer 135 may be formed on the first insulating layer 125 to cover the gate electrode 130. The second insulating layer 135 may prevent the gate electrode 130 from being exposed to the outside. The second insulating layer 135 may include an insulating material, for example, the second insulating layer 135 may include inorganic or organic materials such as silicon nitride (SiNx) or silicon oxide (SiO2, SiOx). The second insulating layer 135 may be formed of the same material as the first insulating layer 125, or may be formed of other materials.

In this example, a barrier pattern 140A, 140B or the drain electrode 150A and the source electrode 150B may be formed in one region of a layer on which the second insulating layer 135 is formed. For example, in an upper region of the drain region D and the source region S of the semiconductor pattern 120, the barrier pattern 140A, 140B, the drain electrode 150A, and the source electrode 150B may be formed.

The drain electrode 150A may be formed to be electrically connected to the drain region D of the semiconductor pattern 120. The source electrode 150B may be formed to be electrically connected to the source region S of the semiconductor pattern 120. The drain electrode 150A and the source electrode 150B may serve as an electrode and wiring.

The drain electrode 150A and the source electrode 150B may be spaced apart from each other with the first insulating layer 125 and the second insulating layer 135 having insulating properties therebetween. The drain electrode 150A and the source electrode 150B may be spaced apart from the gate electrode 130 through the first insulating layer 125 and the second insulating layer 135 having insulating properties.

Accordingly, when a voltage is applied to the gate electrode 130 (i.e., a channel through which a current may flow is formed to the semiconductor pattern 120), the drain electrode 150A and the source electrode 150B may flow a current along a channel formed in the barrier pattern 140A and 140B and the semiconductor pattern 120.

The drain electrode 150A and the source electrode 150B may include a conductive material.

The drain electrode 150A and the source electrode 150B may include Cu. Specifically, in order to solve a flicker phenomenon or a luminance deviation due to voltage drop generated in a display device, a Cu having a high electric conductivity (or a low resistivity) may be used as an electrode. For example, the drain electrode 150A and the source electrode 150B may include Cu having an electrical conductivity higher than that of Au or Mo.

The drain electrode 150A and the source electrode 150B according to an embodiment of the disclosure may be in direct contact with the drain region D and the source region S of the semiconductor pattern 120. In this example, the material included in the drain electrode 150A and the source electrode 150B may be diffused into the drain region D and the source region S of the semiconductor pattern 120. The diffusion into the inside of the drain region D and the source region S of the semiconductor pattern 120 may vary depending on the type of material included in the drain electrode 150A and the source electrode 150B.

When the drain electrode 150A and the source electrode 150B include Cu, a problem in that Cu atom or Cu ion of the drain electrode 150A and the source electrode 150B are diffused into the inside of the drain region D and the source region S of the semiconductor pattern 120 may get worsen.

Referring to FIG. 18, when the drain electrode 150A and the source electrode 150B are formed of Cu, the characteristics of the drain current Ids between the drain electrode 150A and the source electrode 150B according to the gate voltage Vgs of the gate electrode 130 are represented as a first curve 1810, and the first curve 1810 may indicate an abnormal driving characteristic relative to the second curve 1820.

In order to solve the problem, the display module 100 according to an embodiment of the disclosure may include barrier patterns 140A, 140B.

The barrier patterns 140A and 140B may be formed on the drain region D and the source region S. The barrier patterns 140A and 140B may include the first barrier pattern 140A and the second barrier pattern 140B. Specifically, the barrier patterns 140A and 140B may be formed to be in contact with the drain region D and the source region S of the semiconductor pattern 120. In this case, the drain electrode 150A and the source electrode 150B may be formed on the barrier patterns 140A and 140B so as not to be directly in contact with the drain region D and the source region S of the semiconductor pattern 120.

The barrier patterns 140A, 140B may include Zn alloy.

The Zn alloy may include at least one of Ti, Mo, Au, Al, Mg, Sn or Sb, and Zn alloy may include Zn having a content of 90 wt % or more.

Figure 12:
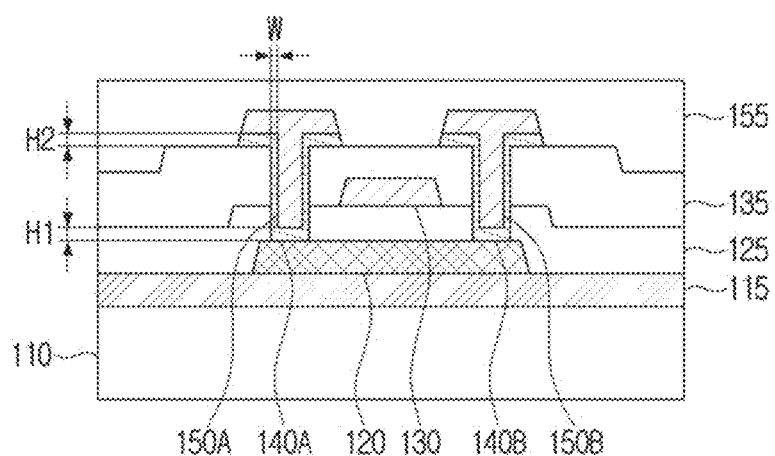
FIG. 12 is a diagram illustrating a method of removing a photoresist pattern according to an embodiment of the disclosure.

The Zn alloy according to an embodiment may be formed with the thickness of greater than or equal to 50 Å and 500 Å or less (H1, see FIG. 12). The barrier patterns 140A, 140B according to an embodiment may be formed to have a side angle greater than or equal to 30 degrees and less than 60 degrees.

Referring to FIG. 12, the barrier patterns 140A and 140B may be formed to surround sidewalls of the first insulating layer 125 and the second insulating layer 135 on the drain region D and the source region S. In this case, the first barrier pattern 140A will be described to omit the description overlapping with the second barrier pattern 140B. 제 The first barrier pattern 140A may be formed to have a width W in a horizontal direction based on a sidewall of the first insulating layer 125 and the second insulating layer 135. At this time, W may be greater than or equal to 0, and may have a value of H1 or less. However, the embodiment is merely an example and various modified embodiments may be possible.

The type and content, thickness, angle, etc. of the material included in the barrier patterns 140A and 140B described above may improve the characteristics of preventing the drain electrode 150A and the source electrode 150B from diffusing into the semiconductor pattern 120. In addition, the type and content, thickness, angle, etc. of the material included in the barrier patterns 140A and 140B may improve electrical conductivity (or resistivity).

In this example, the drain electrode 150A and the source electrode 150B may be formed on the barrier patterns 140A and 140B. Specifically, the drain electrode 150A may be formed on the first barrier pattern 140A, and the source electrode 150B may be formed on the second barrier pattern 140B.

The display module 100 of the disclosure, when a material having excellent electrical conductivity is used for the drain electrode 150A and the source electrode 150B, the barrier pattern 140A and 140B may prevent the diffusion of a material (for example, Cu) included in the drain electrode 150A and the source electrode 150B into the drain region D and the source region S of the semiconductor pattern 120.

In this case, the drain electrode 150A and the source electrode 150B of the semiconductor pattern 120 may be diffused (or introduced) into the drain region D and the source region S of the semiconductor pattern 120 to prevent degradation of electrical characteristics (e.g., electrical conductivity, characteristics that may be driven to the TFT according to the gate voltage, etc.).

Accordingly, the display module 100 of the disclosure may maintain the electrical characteristics of the semiconductor pattern 120 while using a material having excellent electrical conductivity such as Cu, etc., the overall electrical characteristics of the display module 100 may be improved.

In that voltage loss due to resistance in the wiring of the display module 100 is reduced, heat dissipation generated in the wiring may be reduced, constant voltage may be applied to each pixel, and a flicker phenomenon or the like may be prevented.

The display module 100 may improve the electric conductivity of the semiconductor pattern using the barrier patterns 140A, 140B and thus may improve response speed of the display.

Referring back to FIG. 18, the drain current Ids characteristics according to the gate voltage Vgs when the drain electrode 150A and the source electrode 150B are formed on the barriers 140A and 140B may be represented as the second curve 1820. Here, the current may increase as the voltage of the gate electrode 130 increases, and the current in the specific voltage section may exhibit a normal driving characteristic having a linear relationship.

According to an embodiment of the disclosure as described above, a display module for driving a pixel and a manufacturing method thereof may be provided. The embodiment may provide a display module for preventing brightness deviation and flicker phenomenon, and a manufacturing method thereof. Also, a display module having a high response speed and a manufacturing method thereof may be provided.

Figure 1B:
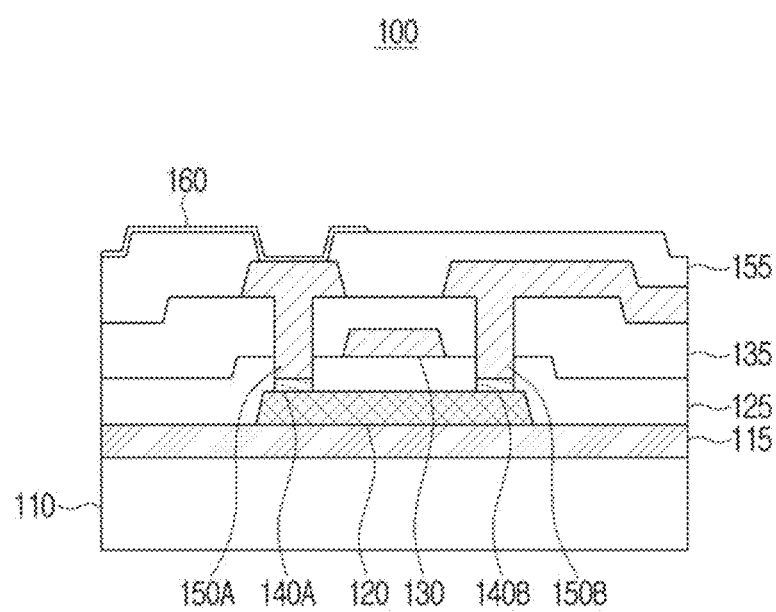
FIG. 1B is a diagram illustrating an additional configuration of a display module according to an embodiment of the disclosure.

FIG. 1B is a diagram illustrating an additional configuration of a display module according to an embodiment of the disclosure.

Figure 16:
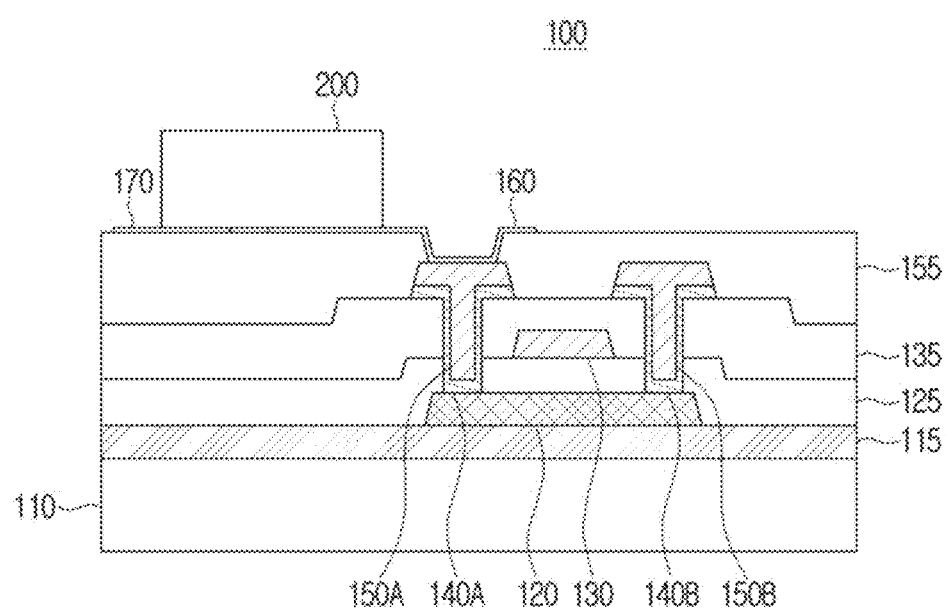
FIG. 16 is a diagram illustrating a method of forming a light emitting element according to an embodiment of the disclosure.

Referring to FIG. 1B, the display module 100 may further include at least one of the substrate 110, the semiconductor pattern 120, the first insulating layer 125, the gate electrode 130, the second insulating layer 135, the barrier patterns 140A, 140B, the drain electrode 150A, the source electrode 150B, and a buffer layer 115, a protective layer 155, a pixel electrode 160, a common electrode, and a micro LED 200 (see FIG. 16).

The buffer layer 115 may be formed between the substrate 110 and the semiconductor pattern 120. The buffer layer 115 may be formed on the substrate 110. In this case, the buffer layer 115 may improve adhesion between layers formed on the buffer layer 115 and the substrate 110. The buffer layer 115 may prevent the material included in the substrate 110 from being diffused into the semiconductor pattern 120.

For this purpose, the buffer layer 115 may be formed of a single layer of silicon nitride (SiNx) or silicon oxide (SiOx) and a multi-layer of silicon nitride (SiNx) and silicon oxide (SiOx). The buffer layer 211 may be variously modified or omitted depending on the structure and type of the substrate 110 and the semiconductor pattern 120.

Figure 13:
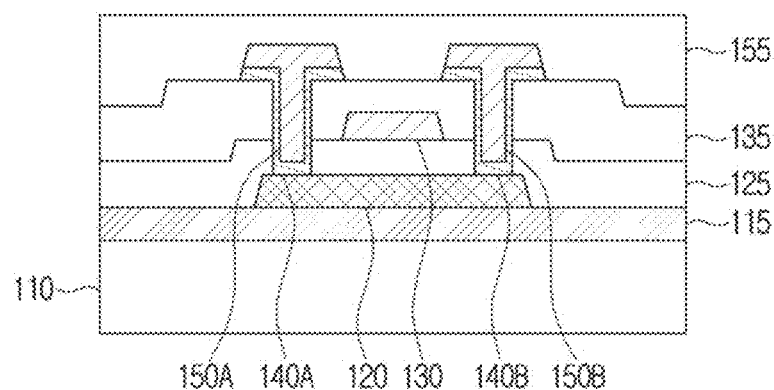
FIG. 13 is a diagram illustrating a method of forming a protective layer according to an embodiment of the disclosure.

Referring to FIGS. 1B and 13, the protective layer 155 may be formed to cover the drain electrode 150A and the source electrode 150B on the second insulating layer 135. The protective layer 155 may be referred to as a passivation layer.

The protective layer 155 may be an insulating layer for protecting the drain electrode 150A and the source electrode 150B formed at a lower portion thereof. Specifically, the protective layer 155 may prevent external foreign substances, hydrogen, moisture, etc. from penetrating into the inside thereof or physical damage to the drain electrode 150A and the source electrode 150B, and the protective layer 155 may prevent the drain electrode 150A and the source electrode 150B from being shorted.

The protective layer 155 may be composed of inorganic materials such as SiNx, SiONx, or SiOx.

Figure 14:
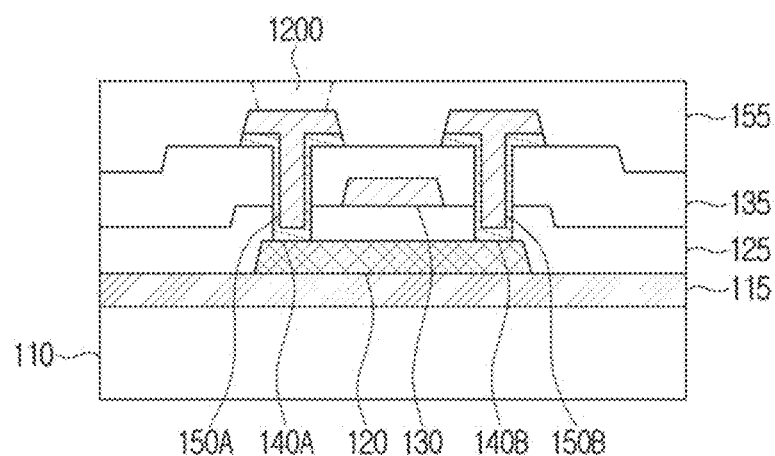
FIG. 14 is a diagram illustrating a method of forming a hole according to an embodiment of the disclosure.

Referring to FIGS. 1B and 14, the protective layer 155 may be formed with a hole 1200 to expose the drain electrode 150A. The pixel circuit 160 may be formed on the internal drain electrode 150A.

Referring to FIGS. 1B and 16, the pixel electrode 160 may be formed on the drain electrode 150A. The common electrode 170 may be formed on a region of the protective layer 155. The location of the common electrode 170 may be differently formed according to a structure such as a flip chip type, a vertical type, etc. of the micro LED 200. The pixel electrode 160 and the common electrode 170 may include a conductive material, for example, the pixel electrode 160 and the common electrode 170 may include at least one of Cu, Ag, Au, Al, and the like. However, this is merely an example and the pixel electrode 160 and the common electrode 170 may be modified to include various conductive materials.

The micro LED (u-LED) may be bonded on the pixel electrode 160 so as to be electrically connected to the pixel electrode 160 and the common electrode 170.

The micro LED 200 may refer to an LED having a width and a height of 1-100 micrometers (µm), respectively. Specifically, the micro LED panel 200 (or µLED) display panel is one of a flat panel display panel and is composed of a plurality of inorganic light emitting diodes (inorganic LEDs) of 100 micrometers or less, respectively. The micro LED display panel provides better contrast, response time and energy efficiency compared to the liquid crystal display (LCD) panel requiring backlight. An organic LED and a micro LED, which is an inorganic light emitting diode, has good energy efficiency, but the micro LED has higher brightness, luminous efficiency, and lifetime than the OLED.

LED refers to an element that emits light (photon packets) of a specific wavelength (or specific color) corresponding to a band gap energy, while electrons provided from the n-type semiconductor and the hole provided from the p-type semiconductor are recombined in the light-emitting layer according to the difference between the voltage applied to the n-type semiconductor layer and the voltage applied to the p-type semiconductor layer. The LED may include one or more semiconductor layers based on AlInGaP-based semiconductor to emit red light having a wavelength of 600 to 750 nm. The LED may include one or more semiconductor layers based on an AlInGaN-based semiconductor to emit blue and green light having a wavelength of 450-490 nm and 500-570 nm, respectively. The micro LED 200 which uses an inorganic material is advantageous in that the burn-in phenomenon of a screen is less, the lifetime is long, the power efficiency is high, and the response time is short, or the like.

The micro LED 200 may have a flip chip type structure in which a positive electrode (e.g., a cathode and an anode) formed on a lower portion of the micro LED 200 is connected to the pixel electrode and the common electrode 160, 170, or a vertical type structure in which an electrode formed on the lower and upper portions of the micro LED 200 is connected to the pixel electrode and the common electrode 160 and 170.

For example, the micro LED device 200 may be bonded on the pixel electrode 160 and the common electrode 170 as shown in FIG. 16 in a flip-chip type. The common electrode 170 is disposed to be spaced apart (separated or insulated) from the pixel electrode 160, and may be formed in an upper region of the protective layer 155. For example, like the vertical type, the micro LED 200 may be bonded on the pixel electrode 160 such that the lower electrode of the micro LED 200 is connected to the pixel electrode 160, and then the common electrode 170 may be formed on the upper electrode of the micro LED 200.

When a channel is formed in the semiconductor pattern 120 according to the voltage of the gate electrode 130, a current flowing along the source electrode 150B, the second barrier pattern 140B, the semiconductor pattern 120, the first barrier pattern 140A, and the drain electrode 150A may be supplied to the micro LED module 200, and the micro LED 200 may emit light having a specific amount (brightness) and color according to supplied currents. As such, the micro LED 200 may be individually driven as a pixel unit (or sub-pixel unit). The driving circuit for driving the micro LED 200 may be implemented by a micro IC disposed in the pixel region to control the driving of at least 2n pixels, and only a channel layer, instead of the TFT element, connecting the micro-IC and each micro LED may be formed on the TFT layer (or the backplane) when the micro-IC is applied. The TFT constituting the TFT layer is not limited to a specific structure or type. The TFT of the disclosure may be implemented as LTPS, oxide TFT, Si TFT (poly silicon, a-silicon), an organic TFT, a graphene TFT, and the like, and only a P-type (or N-type) MOSFET may be formed in a Si-wafer CMOS process.

Although the display module 100 according to an embodiment of the disclosure has been described as including the micro LED 200, the display module 100 may be modified to include various light emitting elements instead of the micro LED 200. Here, the light emitting element may include at least one of a mini LED (LED having a size of 100-200 micrometers (μm) in length and height, an organic light emitting diode (OLED) using an organic material, and a quantum dot light emitting diode (QLED) using a quantum dot. The display module 100 according to an embodiment of the disclosure may control pixels using a backlight unit and a liquid crystal.

FIG. 1A and FIG. 1B illustrate cross-sectional views of some areas in one pixel (or sub-pixel) of the display module 100. The display module 100 may include at least one pixel (or sub-pixel), and for each pixel (or each sub-pixel), the foregoing description may be equally applied.

As described above, the display module 100 according to an embodiment of the disclosure may visually display an image composed of a plurality of pixels according to a voltage difference between a voltage applied to the gate electrode 130 and a voltage of the drain electrode 150A/source electrode 150B in a pixel (or sub-pixel) unit.

The display module 100 according to an embodiment of the disclosure may be implemented as a display device by itself, and may be implemented as a single display device by combining a plurality of display modules. For example, the plurality of display modules may be tiled to a matrix type (e.g., Q×W, Q and W each being a natural number) to configure one display device.

The display module 100 may be installed and applied to a wearable device, a portable device, a handheld device as a single unit, and electric products (mainly a small display device) requiring various displays or electronic fields and the display module 100 may be applied to an electronic product (mainly a large display device) such as a monitor, a high-resolution TV, and a signage (or a digital signage), an electronic display board, and the like through a plurality of units of assembly arrangement. The display module 100 may be implemented in various forms such as a TV, a monitor, a smartphone, a portable multimedia device, a portable communication device, a smart glass, a smart window, a smart watch, a head-mount display (HMD), a wearable device, a portable device, a handheld device, a signage, an electronic display, an advertisement board, a cinema screen, a video wall, etc., but is not limited thereto. The display module 100 according to an embodiment may be implemented as a transparent display device such as a smart window, a smart glass, or the like.

Hereinafter, a method of manufacturing a display module 100 according to an embodiment of the disclosure will be described with reference to the accompanying drawings.

FIG. 2 is a flowchart illustrating a method of manufacturing a display module according to an embodiment of the disclosure.

Referring to FIG. 2, a method of manufacturing the display module 100 includes forming the semiconductor pattern 120 on the substrate 110 in operation S210; forming the first insulating layer 125 covering the semiconductor pattern 120 on the substrate 110 in operation S220; forming the gate electrode 130 on a region corresponding to a gate region G of the semiconductor pattern 120 on the first insulating layer 125 in operation S230; forming the second insulating layer 135 covering the gate electrode 130 on the first insulating layer 125 in operation S240; forming a first hole 800B passing through the first insulating layer 125 and the second insulating layer 135 so as to expose a source region S of the semiconductor pattern 120 and forming a second hole 800A passing through the first insulating layer 125 and the second insulating layer 135 so as to expose a drain region D of the semiconductor pattern 120 in operation S250; and forming a barrier pattern 140A, 140B on the drain region D and the source region S in the first hole 800A and second hole 800B, and forming the source electrode 150B and the drain electrode 150A respectively on the barrier patterns 140A, 140B in operation S260.

Hereinafter, each operation of the method of manufacturing the display module 100 of the disclosure will be described with reference to the accompanying drawings.

Referring to FIG. 2, the manufacturing method of the display module 100 may form the semiconductor pattern 120 on the substrate 110 in operation S210.

The semiconductor pattern 120 may LTPS. However, this is merely an example and the semiconductor pattern 120 may include an oxide semiconductor, a-Si, and the like.

The semiconductor layer may be formed on the substrate 110 through various deposition methods such as sputtering, evaporation, e-beam evaporation, chemical vapor deposition (CVD), pulsed laser deposition, physical vapor deposition (PVD), plasma enhanced CVD, atomic layer deposition (ALD), etc. A portion of the semiconductor layer may then be removed through a photoresist (PR), exposure, development, etching (patterning), a semiconductor layer which remains on the substrate after a portion is removed may be referred to as the semiconductor pattern 120.

In the example of LTPS, LTPS may be formed after depositing a-Si and then crystalizing the same through laser. A specific detail will be described below.

The manufacturing method according to an embodiment of the disclosure may include forming a buffer layer 115. This will be described with reference to FIGS. 3 and 4.

Figure 3:
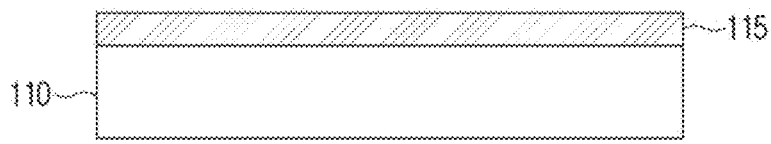
FIG. 3 is a diagram illustrating a method of forming a buffer layer according to an embodiment of the disclosure.
Figure 4:
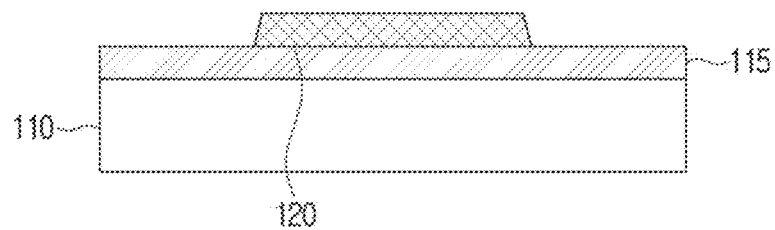
FIG. 4 is a diagram illustrating a method of forming a semiconductor pattern according to an embodiment of the disclosure.

FIG. 3 is a diagram illustrating a method of forming a buffer layer according to an embodiment of the disclosure; FIG. 4 is a diagram illustrating a method of forming a semiconductor pattern according to an embodiment of the disclosure.

Referring to FIG. 3, the manufacturing method of the disclosure may include forming the buffer layer 115 on the substrate 110 to prevent the material included in the substrate 110 from being diffused into the semiconductor pattern 120. In this case, the step of forming the buffer layer 115 may be performed before forming the semiconductor pattern 120. The buffer layer 115 may be formed on the substrate 110 through sputtering, evaporation, e-beam evaporation, CVD, ALD, PVD, or pulsed laser deposition, or the like.

However, this is merely an example and it may also be possible to form the semiconductor pattern 120 on the substrate 110 without forming the buffer layer 115. For convenience, it is assumed that the manufacturing method of the disclosure includes forming the buffer layer 115.

Referring to FIG. 4, the forming the semiconductor pattern 120 in operation S210 may include forming the semiconductor pattern 120 on the buffer layer 115 after the buffer layer 115 is formed on the substrate 110. The semiconductor pattern 120 may be formed in a specific region of the upper region of the substrate 110 by forming the semiconductor layer through the various deposition methods described above and removing a portion of the semiconductor layer through etching.

According to an embodiment, the semiconductor pattern 120 may include LTPS.

The forming the semiconductor pattern 120 may include depositing amorphous silicon (a-Si) on the buffer layer 115; and forming the LTPS with changed crystalline arrangement of the a-Si by irradiating the a-Si with laser.

Here, a-Si may be formed on the buffer layer 115 according to the various deposition methods described above, and may be formed in the form of a thin film (e.g., a thickness of 500 μm or the like). The laser may also be an excimer laser, and the excimer laser may refer to a pulsed ultraviolet (UV) light. By annealing (or heat treatment) by irradiating a-Si with laser, LTPS with changed crystalline arrangement may be formed. In the case of a laser, there is an advantage of not damaging the substrate 110 in that annealing is possible for a temporarily shorter time for a specific region.

This is merely an example, and LTPS may be formed through changing a-Si crystalline arrangement through various methods such as rapid thermal annealing (RTA), solid phase crystallization (SPC), metal induced crystallization (MIC), metal induced lateral crystallization (MILC), sequential lateral solidification (SLS), or the like.

The first insulating layer 120 covering the semiconductor pattern 120 may be formed on the substrate 110 in operation S220. This will be described with reference to FIG. 5.

Figure 5:
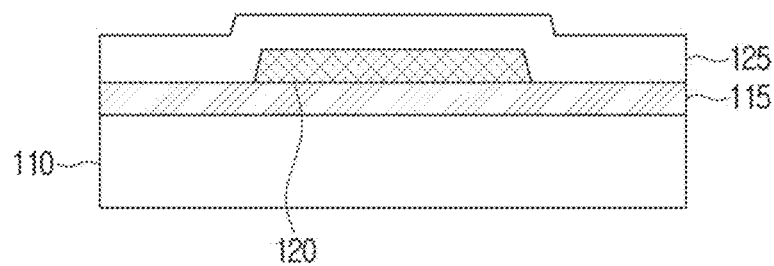
FIG. 5 is a diagram illustrating a method of forming a first insulating layer according to an embodiment of the disclosure.

FIG. 5 is a diagram illustrating a method of forming a first insulating layer according to an embodiment of the disclosure.

Referring to FIG. 5, the first insulating layer 125 may be formed on the substrate 110 to cover the semiconductor pattern 120. The first insulating layer 125 may be formed to be in contact with an upper surface and a side surface of the semiconductor pattern 120 and an upper surface of the substrate 110. The first insulating layer 125 may be formed to surround the semiconductor pattern 120 so that the semiconductor pattern 120 is not exposed to the outside.

The insulating material such as SiNx and SiOx may form the first insulating layer 125 by the method such as plasma enhanced chemical vapor deposition (PECVD), atmospheric pressure CVD (APCVD), low pressure CVD (LPCVD), Atomic Layer Deposition (ALD), or the like.

The gate electrode 130 may be formed on a region corresponding to the gate region G of the semiconductor pattern 120 in the first insulating layer 125 in operation S230. This will be described with reference to FIG. 6.

Figure 6:
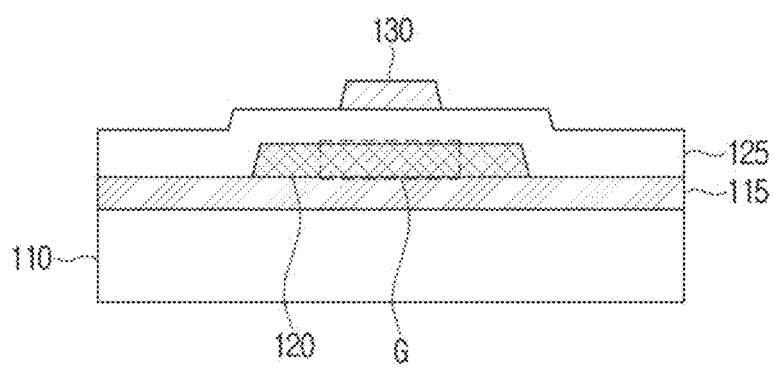
FIG. 6 is a diagram illustrating a method of forming a gate electrode according to an embodiment of the disclosure.

FIG. 6 is a diagram illustrating a method of forming a gate electrode according to an embodiment of the disclosure.

Referring to FIG. 6, the gate electrode 130 may be formed on a region corresponding to the gate region G in the first insulating layer 125. The region corresponding to the gate region G of the first insulating layer 125 may refer to one region of the first insulating layer 125 present on the gate region G. As such, the gate electrode 130 and the semiconductor pattern 120 may be spaced part with the first insulating layer 125 having insulation therebetween, and the gate electrode 130 and the semiconductor pattern 120 may be electrically insulated.

The gate electrode 130 may include low-resistance conductive material, and for example, the gate electrode 130 may include Cu. This is merely an example, and the gate electrode 130 may be implemented with a material including various metal materials such as Au, Ag, Mo, Al, etc.

The gate electrode 130 may be formed through various deposition methods such as electrical plating (EP), sputtering, evaporation, e-beam evaporation, CVD, ALD, PVD, pulsed laser deposition, etc.

The second insulating layer 135 covering the gate electrode 130 may be formed on the first insulating layer 125 in operation S240. This will be described with reference to FIG. 7.

Figure 7:
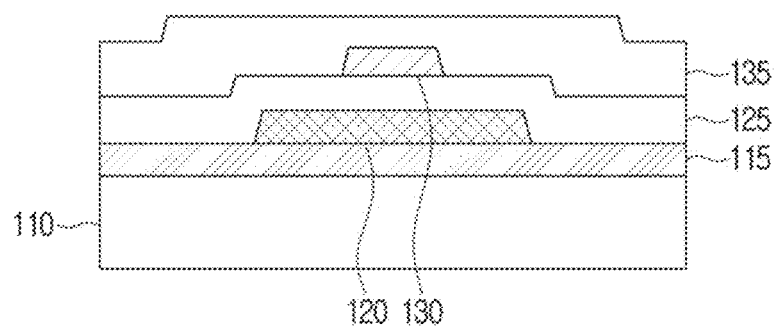
FIG. 7 is a diagram illustrating a method of forming a second insulating layer according to an embodiment of the disclosure.

FIG. 7 is a diagram illustrating a method of forming a second insulating layer according to an embodiment of the disclosure.

Referring to FIG. 7, the second insulating layer 135 may be formed on the first insulating layer 125 to cover the gate electrode 130. Specifically, the second insulating layer 135 may be formed to be in contact with an upper surface and a side surface of the gate electrode 130 and an upper surface of the first insulating layer 125. That is, the second insulating layer 135 may have a structure to surround the gate electrode 130 so that the gate electrode 130 is not exposed to the outside.

The second insulating layer 135 may be formed by the insulating material such as SiNx or SiOx through the method such as plasma enhanced chemical vapor deposition (PECVD), atmospheric pressure CVD (APCVD), low pressure CVD (LPCVD), or Atomic Layer Deposition (ALD).

The first hole 800A passing through the first insulating layer 125 and the second insulating layer 135 so as to expose the drain region D of the semiconductor pattern 120 may be formed and the second hole 800B passing through the first insulating layer 125 and the second insulating layer 135 so as to expose the source region S of the semiconductor pattern 120 may be formed in operation S250. This will be described with reference to FIG. 8.

Figure 8:
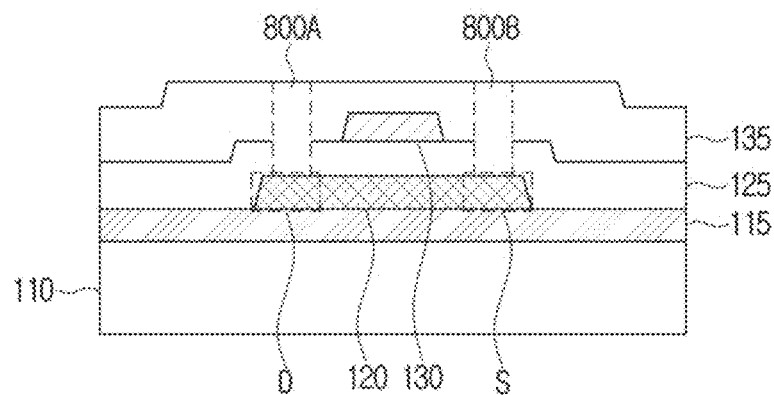
FIG. 8 is a diagram illustrating a method of forming a hole according to an embodiment of the disclosure.

FIG. 8 is a diagram illustrating a method of forming a hole according to an embodiment of the disclosure.

Referring to FIG. 8, a first hole 800A penetrating the first insulating layer 125 and the second insulating layer 135 may be formed so as to expose the drain region D of the semiconductor pattern 120, and a second hole 800B penetrating the first insulating layer 125 and the second insulating layer 135 may be formed to expose the source region S of the semiconductor pattern 120.

The first hole 800A may be a contact hole (or via hole) for exposing the drain region D of the semiconductor pattern 120, and the second hole 800B may be a contact hole (or via hole) for exposing the source region S of the semiconductor pattern 120. The first hole 800A and the second hole 800B may represent a region removed from the first insulating layer 125 and the second insulating layer 135 to expose the drain region D and the source region S. A conductive material for performing the role of an electrode and a wiring may be filled in the first hole 800A and the second hole 800B.

The first hole 800A and the second hole 800B may be formed through laser processing, drill processing, extreme ultraviolet (EUV), etching, or the like.

The barrier patterns 140A and 140B may be formed on the drain region D and the source region S in the first hole 800A and the second hole 800B, and the drain electrode 150A and the source electrode 150B may be formed on the barrier patterns 140A and 140B, respectively in operation S260.

As an embodiment, the forming the barrier pattern 140A, 140B, the drain electrode 150A, and the source electrode 150B may include forming the barrier layer 140 on the second insulating layer 135 in which the first hole 800A and second hole 800B are formed; forming the electrode layer 150 on the barrier layer 140; and forming the drain electrode 150A and the source electrode 150B on each barrier pattern along with each barrier pattern 140A, 140B, by patterning the barrier layer 140 and the electrode layer 150 simultaneously. The drain electrode 150A and the source electrode 150B may be formed along with each barrier pattern 140A, 140B through a photolithography process. This will be described with reference to FIGS. 9 to 12.

Figure 9:
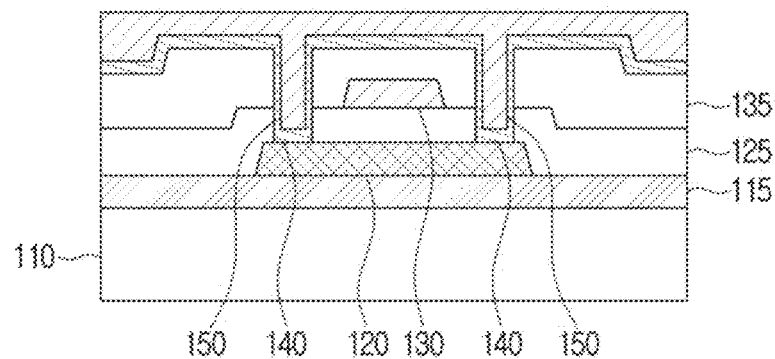
FIG. 9 is a diagram illustrating a method of forming a barrier layer and an electrode layer according to an embodiment of the disclosure.

FIG. 9 is a diagram illustrating a method of forming a barrier layer and an electrode layer according to an embodiment of the disclosure.

Referring to FIG. 9, the barrier layer 140 may be formed on the second insulating layer 135 having the first hole 800A and the second hole 800B. Here, the barrier layer 140 may be formed to be continuous in the same level (the number of layers or steps), and the barrier layer 140 may be formed of barrier patterns 140A and 140B separated from each other through patterning.

The barrier layer 140 may form the barrier layer 140 on the second insulating layer 135 having the first hole 800A and the second hole 800B. In this case, the barrier layer 140 may be formed on the drain region D and the source region S of the semiconductor pattern 120 inside the first hole 800A and the second hole 800B.

According to an embodiment of the disclosure, the barrier layer 140 may be formed to surround a sidewall of the first insulating layer 125 and the second insulating layer 135 in the first hole 800A and the second hole 800B.

The electrode layer 150 may be formed on the barrier layer 140. In this case, the electrode layer 150 may be formed on the barrier layer 140 formed inside the first hole 800A and the second hole 800B. The electrode layer 150 may be formed of the drain electrode 150A and the source electrode 150B that are separated from each other through patterning.

The barrier layer 140 and the electrode layer 150 may be formed through various methods such as electroplating (EP), sputtering, evaporation, e-beam evaporation, chemical vapor deposition (CVD), atomic layer deposition (ALD), physical vapor deposition (PVD), pulsed laser deposition, etc.

The forming the electrode layer 150 may include, after forming the barrier layer 140, forming the electrode layer 150 in the barrier layer 40 consecutively in the chamber formed with the barrier layer 140 to prevent oxidation of the barrier patterns 140A, 140B. This is to prevent oxidation of the barrier layer 140 by continuously depositing the barrier layer 140 and the electrode layer 150 in the same chamber.

The barrier layer 140 and the barrier patterns 140A and 140B may include substantially the same material, and the electrode layer 150 and the drain electrode 150A and the source electrode 150B may include substantially the same material. That is, the barrier layer 140 may include a Zn-based alloy as described above in the barrier patterns 140A and 140B, and the electrode layer 150 may include Cu as described above with respect to the drain electrode 150A and the source electrode 150B. However, the embodiment is merely an example and may be modified to various embodiments.

The remaining areas except for the area corresponding to the first hole 800A and the second hole 800B may be removed from the barrier layer 140 and the electrode layer 150. In this case, wet etching that removes a particular region of the barrier layer 140 and the electrode layer 150 through a chemical reaction using a corrosion solution or dry etching that removes a particular region of the barrier layer 140 and the electrode layer 150 using a reactive gas (e.g., plasma, etc.), ion, or the like, may be used.

According to an embodiment of the disclosure, a specific region may be removed using wet etching. Wet etching is excellent in the selectivity (the degree of etching only the target material), productivity (processing speed is fast and handling a lot of amount), and economical strength (simple equipment and low cost).

Figure 10:
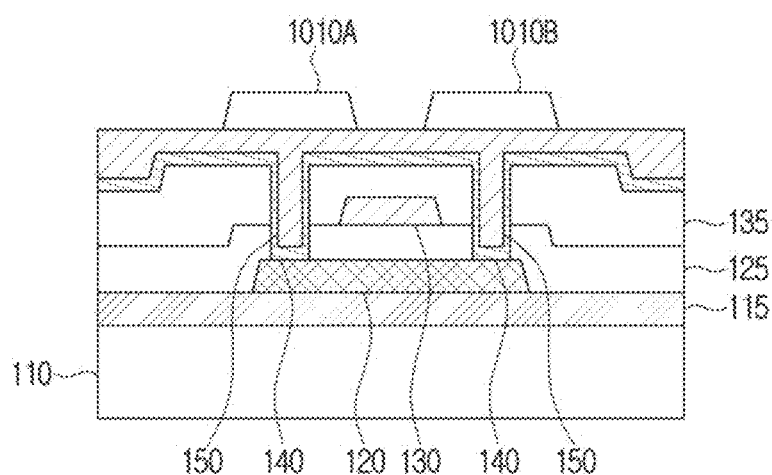
FIG. 10 is a diagram illustrating a method of forming a photoresist pattern according to an embodiment of the disclosure.

FIG. 10 is a diagram illustrating a method of forming a photoresist pattern according to an embodiment of the disclosure.

Referring to FIG. 10, photo resist patterns 1010A, 1010B may be formed on a region corresponding to the first hole 800A and the second hole 800B in the electrode layer 150.

In detail, after forming the photoresist layer on the electrode layer 150 and partially exposing the light to the photoresist layer, the photoresist pattern 1010A, 1010B may be formed by removing a portion in which coupling force among atoms is weak portion between molecules in the photoresist layer through the development.

The photoresist patterns 1010A, 1010B or the photoresist layer may include a photosensitive material, a photo active agent, a polymer resin, a solvent, and the like. The photosensitive material may include a material (positive type) in which a coupling force between molecules becomes strong by causing an optical reaction to light of a specific wavelength (UV light, EUV light, etc.) or a material (negative type) in which a coupling force between molecules becomes weak. In addition, the photoresist patterns 1010A, 1010B or the photoresist layer may have corrosion resistance to the corrosion solution used in the etching. While the corrosion solution may include non-hydrogen peroxide, it is only one embodiment, and the corrosion solution may include hydrogen peroxide.

In this case, the photoresist patterns 1010A and 1010B may be formed on regions corresponding to the first holes 800A and the second holes 800B. The region corresponding to the first hole 800A and the second hole 800B may be an upper region of the electrode layer 150 formed on the first hole 800A and the second hole 800B, and the area corresponding to the first hole 800A and the second hole 800B may be spaced apart from each other. However, in one embodiment, the area corresponding to the first hole 800A and the second hole 800B may be a region in which the first hole 800A and the second hole 800B are spaced apart from each other in a horizontal direction.

Figure 11:
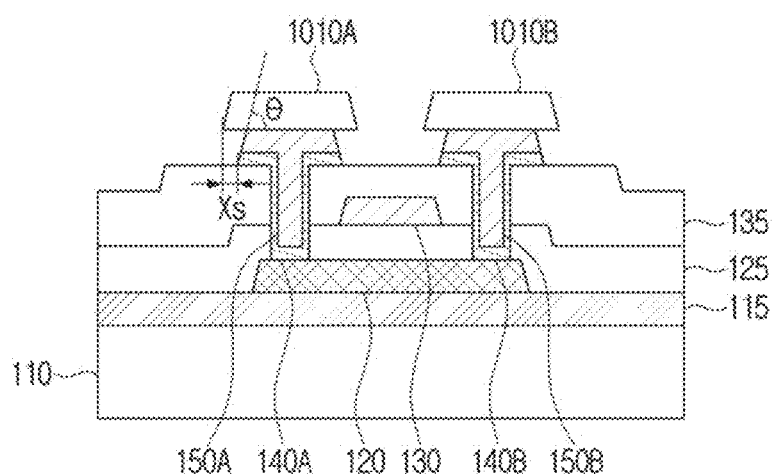
FIG. 11 is a diagram illustrating a method of forming a barrier pattern, a drain electrode, and a source electrode according to an embodiment of the disclosure.

FIG. 11 is a diagram illustrating a method of forming a barrier pattern, a drain electrode, and a source electrode according to an embodiment of the disclosure.

Referring to FIG. 11, based on the photoresist patterns 1010A and 1010B, the remaining region other than the region corresponding to the first hole 800A and the second hole 800B may be removed from the barrier layer 140 and the electrode layer 150 through etching.

Simultaneously, the barrier pattern 140A and 140B may be formed on the drain region D and the source region S in the first hole 800A and the second hole 800B, and the drain electrode 150A and the source electrode 150B may be formed on the barrier patterns 140A and 140B, respectively.

The drain electrode 150A and the source electrode 150B may include Cu. This is merely an example and may be modified to various embodiments.

The barrier patterns 140A, 140B may include Zn-based alloy. The Zn-based alloy may include at least one of Ti, Mo, Au, Al, Mg, Sn, and Sb, and comprises Zn having content greater than or equal to 90 wt %. This is merely an example and may be modified to various embodiments.

The Zn-based alloy may be formed to have thickness greater than or equal to 50 Å and less than or equal to 500 Å. This is merely an example and may be modified to various embodiments.

The barrier patterns 140A and 140B formed according to an embodiment of the disclosure may have a side angle θ greater than equal to 30 degrees and less than 60 degrees.

Here, the side angle θ may represent an angle (slope) of the side of the material relative to the bottom surface of the material. The side angle θ may be an index to indicate the etch characteristics due to the isotropic (vertical or horizontal etch rate) of wet etching. The side angle θ may be referred to as a taper angle T/A.

The lower the side angle θ, the higher the activity with respect to etching than the electrode layer 150 (i.e., etching of the barrier layer 140 formed on the lower portion of the electrode layer 150 becomes active), undercut may occur. The higher the side angle θ, the lower the activity with respect to etching than the electrode layer 150 (i.e., no etching of the barrier layer 140 formed at the lower portion of the electrode layer 150), and desired wiring pattern may not be formed. Accordingly, it may be desirable for the barrier patterns 140A to 140B to be made of a material having the side angle θ greater than or equal to 30 degrees and less than 60 degrees.

When the barrier patterns 140A and 140B have the side angle θ of 30 degrees or more and less than 60 degrees, patterning is possible without a residue on an area to be removed from the barrier layer 140 through etching, and an ideal fine pattern shape may be obtained. Thus, excellent etching characteristics may be obtained.

The barrier patterns 140A and 140B formed according to an embodiment of the disclosure may have a skew (Xs) of 0.2 to 1.0 μm. Here, the skew Xs may represent distance between the lower edge of the etched pattern (e.g., the barrier pattern 140A, 140B), or the drain/source electrode 150A, 150B) and the lower edge of the photoresist patterns 1010A, 1010B. Skew may also be an index to indicate etch characteristics.

Hereinbelow, the etching characteristic will be described with reference to FIGS. 17A and 17B. FIGS. 17A and 17B are diagrams illustrating an etching characteristic according to an embodiment of the disclosure.

Referring to FIGS. 17A and 17B, the first characteristics 1710A, 1710B represent an etching characteristic for the case where a photoresist pattern is formed on a single layer (hereinafter, referred to as a Zn layer) composed of Zn. The second characteristics 1720A and 1720B represent the etching characteristics when the Zn layer, the Cu layer, and the photoresist pattern are sequentially formed. The third characteristics 1730A and 1730B represent the etching characteristics when the Zn-based alloy (Zn—Ti alloy) layer and the photoresist pattern are sequentially formed. The fourth characteristics 1740A and 1740B represent the etching characteristics of the Zn-based alloy (Zn—Ti alloy) layer in which the Zn-based alloy (Zn—Ti alloy) layer, the Cu layer, and the photoresist pattern are sequentially formed.

It may be seen that an undercut occurs in the case of the first characteristics 1710A, 1710B to the third characteristics 1730A, 1730B. The undercut may refer to a groove or a concave formed on a side surface of the pattern by excessive etching, and when an undercut occurs, foreign substances, moisture, etc. may penetrate to the side where the undercut occurs, thereby generating an electrical defect or reducing the durability (or reliability). In addition, the adhesion of the pattern may be reduced so that the pattern may be separated from the substrate or the like.

In the case of the fourth characteristics 1740A and 1740B, the undercut may not occur and skew is lower than other characteristics so the etching feature is excellent.

When the second characteristic (1720A, 1720B) and the fourth characteristic (1740A, 1740B) are compared, using Zn-based alloy such as the fourth characteristics 1740A, 1740B rather than using Zn single metal such as the second characteristics 1720A, 1720B for the barrier pattern 140A, 140B as the lower layer of the Cu layer may have a more excellent etching characteristic.

When the third characteristic (1730A, 1730B) and the fourth characteristic (1740A, 1740B) are compared, it may be seen that an etching characteristic of the fourth characteristic (1740A, 1740B) having the Cu layer formed thereon is continuously formed on the Zn—Ti-based alloy layer is more excellent than the third characteristic (1730A, 1730A) that is not formed with the Cu layer on the upper portion of the Zn—Ti alloy layer. It may be seen that when the Cu layer is not continuously formed on the upper portion of the Zn—Ti alloy, oxidation is generated and the etching characteristics are deteriorated.

When the Zn-based alloy is used in the barrier patterns 140A and 140B as described above, it may be seen that the etching characteristics are excellent. In addition, if the barrier patterns 140A and 140B are Zn-based alloys and the drain electrodes 150A and the source electrode 150B formed on the barrier patterns 140A and 140B are Cu, when the barrier patterns 140A and 140B and the drain electrodes 150A and the source electrode 150B are continuously formed in the same chamber, the etching characteristic is excellent.

FIG. 12 is a diagram illustrating a method of removing a photoresist pattern according to an embodiment of the disclosure.

Referring to FIG. 12, after the barrier pattern 140A, 140B and the drain electrode 150A and the source electrode 150B are formed through etching, the photoresist patterns 1010A and 1010B present on the drain electrode 150A and the source electrode 150B may be removed. The photoresist patterns 1010A and 1010B may be removed through a remover. The remover may include at least one of a composition comprising an organic amine compound and various organic solvents, monoethanolamine, or hydroxylamine. However, this is merely an example and a remover may be implemented as a variety of materials.

In the above embodiment, the drain electrode 150A and the source electrode 150B may be formed along with each barrier pattern 140A, 140B through a photolithography process, but this is merely an example and after forming the barrier patterns 140A and 140B through deposition, inkjet processes, etc., it is possible to form the drain electrode 150A and the source electrode 150B on the barrier patterns 140A and 140B.

The manufacturing method according to an embodiment may include forming the protective layer 155. This will be described with reference to FIG. 13.

FIG. 13 is a diagram illustrating a method of forming a protective layer according to an embodiment of the disclosure.

Referring to FIG. 13, a protective layer 155 may be formed on the second insulating layer 135 to cover the drain electrode 150A and the source electrode 150B.

The protective layer 155 may be an insulating layer for protecting the drain electrode 150A and the source electrode 150B formed at a lower portion thereof. In addition, the protective layer 155 may function to planarize the upper surface of the protective layer 155.

For this purpose, the protective layer 155 may be formed by spin coating with at least one organic insulating material selected from the group consisting of polyimide, polyamide, acrylic resin, benzocyclobutene, or phenolic resin. The protective layer 155 may be formed of an inorganic insulating material selected from the group consisting of $SiO_2$, $SiN_x$, $Al_2O_3$, $CuO_x$, $Tb_4O_7$, $Y_2O_3$, $Nb_2O_5$, $Pr_2O_3$ as well as organic insulating materials as shown above. The protective layer 155 may be formed of a multi-layered structure in which an organic insulating material and/or an inorganic insulating material alternate.

The manufacturing method according to an embodiment may include bonding the micro LED 200 on the pixel electrode 160 so as to be connected to the common electrode 170 separate from the pixel electrode 160, and the pixel electrode 160. This will be described with reference to FIGS. 14 to 16. For convenience, a state in which the protective layer 155 is formed will be assumed.

FIG. 14 is a diagram illustrating a method of forming a hole according to an embodiment of the disclosure.

Referring to FIG. 14, a hole 1200 for exposing one surface (e.g., an upper surface) of the drain electrode 150A may be formed in the protective layer 155. The hole 1200 may represent a region removed from the protective layer 155 to electrically connect the drain electrode 150A to the pixel electrode 160.

For this purpose, holes 1200 may be formed through laser machining, drilling, extreme ultraviolet (EUV), etching, and the like.

Figure 15:
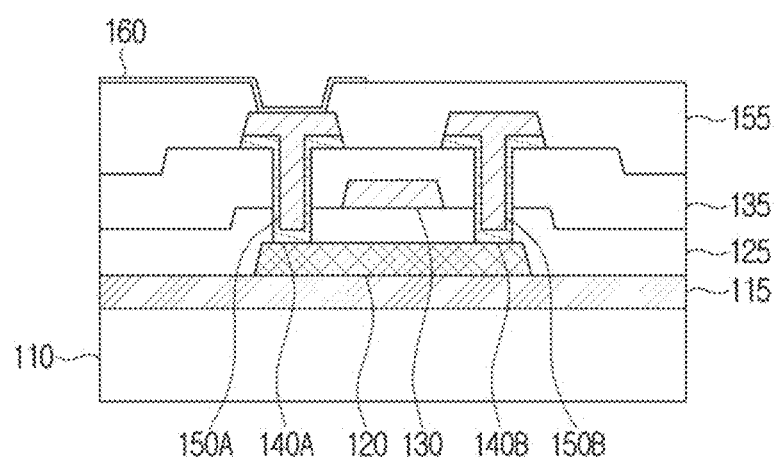
FIG. 15 is a diagram illustrating a method of forming a pixel electrode according to an embodiment of the disclosure.

FIG. 15 is a diagram illustrating a method of forming a pixel electrode according to an embodiment of the disclosure; FIG. 16 is a diagram illustrating a method of forming a light emitting element according to an embodiment of the disclosure.

Referring to FIGS. 15 and 16, a pixel electrode 160 may be formed on the drain electrode 150A in the hole 1200. In this case, a common electrode 170 may be formed on the protective layer 155 to be separated (or insulated) from the pixel electrode 160. A position of the common electrode 170 may be formed according to a structure such as a flip chip type, a vertical type, etc. of the micro LED 200. According to the structure of the common electrode 170, the pixel electrode 160 and the common electrode 170 may be formed simultaneously or sequentially.

The pixel electrode 160 and the common electrode 170 may include a conductive material, for example, the pixel electrode 160 and the common electrode 170 may include at least one of Cu, Ag, Au, Al, and the like. However, this is merely an example and the pixel electrode 160 and the common electrode 170 may be modified to include various conductive materials.

For this purpose, the pixel electrode 160 and the common electrode 170 may be formed through various methods such as electroplating (EP), sputtering, evaporation, e-beam evaporation, chemical vapor deposition (CVD), atomic layer deposition (ALD), physical vapor deposition (PVD), pulsed laser deposition, etc.

The micro LED 200 may be bonded on the pixel electrode 160 to be electrically connected to the pixel electrode 160 and the common electrode 170. For example, assuming the flip chip type as shown in FIG. 16, the pixel electrode 160 and the common electrode 170 may be formed on the same layer, and the micro LED 200 may be bonded on the pixel electrode 160 and the common electrode 170 so that both electrodes formed on the lower portion of the micro LED 200 are connected to the pixel electrode 160 and the common electrode 170.

In accordance with the embodiment of the disclosure, the various embodiments described above may be practiced with other computer-readable media including instructions stored on a storage medium readable by a machine (e.g., computer). The device may include an electronic device (e.g., electronic apparatus 100) in accordance with the disclosed embodiments as an apparatus that is operable to invoke stored instructions from the storage medium and act upon the called instructions. When an instruction is executed by a processor, the processor may perform the function corresponding to the instruction, either directly, or using other components under the control of the processor. The instructions may include code generated or executed by the compiler or interpreter. The machine-readable storage medium may be provided in the form of a non-transitory storage medium. Here, "non-transitory" means that the storage medium does not include a signal and is tangible, but does not distinguish whether data is permanently or temporarily stored in a storage medium.

According to various example embodiments of the disclosure, a method may be provided in a computer program product. A computer program product may be exchanged between a seller and a purchaser as a commodity. A computer program product may be distributed in the form of a machine-readable storage medium (e.g., compact disc read only memory (CD-ROM)) or distributed online through an application store (e.g. PlayStore™) In the case of on-line distribution, at least a portion of the computer program product may be stored temporarily or at least temporarily in a storage medium such as a manufacturer's server, a server of an application store, or a memory of a relay server.

Each of the elements (for example, a module or a program) according to various example embodiments may include a single entity or a plurality of entities, and some sub-elements of the abovementioned sub-elements may be omitted, the elements may be further included in various embodiments. Alternatively or additionally, some elements (e.g., modules or programs) may be integrated into one entity to perform the same or similar functions performed by each respective element prior to integration. Operations performed by a module, program, or other element, in accordance with various embodiments, may be performed sequentially, in a parallel, repetitive, or heuristically manner, or at least some operations may be performed in a different order, omitted, or other operations may be added.

What is claimed is:

1. A method of manufacturing a display module, the method comprising:
    forming a semiconductor pattern on a substrate;
    forming a first insulating layer covering the semiconductor pattern on the substrate;
    forming a gate electrode on a region of the first insulating layer corresponding to a gate region of the semiconductor pattern;
    forming a second insulating layer covering the gate electrode on the first insulating layer;
    forming a first hole passing through the first insulating layer and the second insulating layer to expose a drain region of the semiconductor pattern and forming a second hole passing through the first insulating layer and the second insulating layer to expose a source region of the semiconductor pattern; and forming a first barrier pattern on the drain region in the first hole and a second barrier pattern on the source region in the second hole, and forming a drain electrode on the first barrier pattern and a source electrode on the second barrier pattern, wherein the drain electrode and the source electrode comprise Cu, and the first barrier pattern and the second barrier pattern comprise Zn-based alloy comprising Ti.

2. The method of claim 1, wherein the Zn-based alloy comprises Zn having content greater than or equal to 90wt % and the Ti.

3. The method of claim 1, wherein the Zn-based alloy has a thickness in a range of 50 Å to 500Å.

4. The method of claim 1, wherein the forming the first barrier pattern, the second barrier pattern, the drain electrode, and the source electrode comprises:

forming a barrier layer on the second insulating layer in which the first hole and the second hole are formed;

forming an electrode layer on the barrier layer; and forming the first barrier pattern, the second barrier pattern, the drain electrode and the source electrode by patterning the barrier layer and the electrode layer simultaneously.

5. The method of claim 4, wherein the patterning the barrier layer and the electrode layer simultaneously comprises performing a photolithography process.

6. The method of claim 4, wherein the forming the electrode layer comprises, after forming the barrier layer, forming the electrode layer in the barrier layer consecutively in a chamber to prevent oxidation of the first barrier pattern and the second barrier pattern.

7. The method of claim 1, wherein the semiconductor pattern comprises low temperature poly silicon (LTPS), and wherein the forming the semiconductor pattern comprises:

forming a buffer layer to block diffusion of a material included in the substrate into the semiconductor pattern on the substrate;

depositing amorphous silicon (a-Si) on the buffer layer; and forming the LTPS with changed crystalline arrangement of the a-Si by irradiating the a-Si with a laser.

8. The method of claim 1, further comprising:

forming a pixel electrode on the drain electrode; and bonding a micro light emitting diode on the pixel electrode to be connected to the pixel electrode and a common electrode separate from the pixel electrode.

* * * * *